United States Patent

Chia et al.

Patent Number: 5,923,047
Date of Patent: Jul. 13, 1999

[54] SEMICONDUCTOR DIE HAVING SACRIFICIAL BOND PADS FOR DIE TEST

[75] Inventors: Chok J. Chia; Qwai H. Low; Maniam Alagaratnam, all of Cupertino, Calif.

[73] Assignee: LSI Logic Corporation, Milpitas, Calif.

[21] Appl. No.: 08/837,618

[22] Filed: Apr. 21, 1997

Related U.S. Application Data

[51] Int. Cl.$^6$ .............................. H01L 21/60; H01L 21/66
[52] U.S. Cl. .......................... 257/48; 257/784; 257/786; 257/620
[58] Field of Search ............................... 257/48, 784, 786, 257/620

[56] References Cited

U.S. PATENT DOCUMENTS

| | | | |
|---|---|---|---|
| 5,003,374 | 3/1991 | Vokoun, III | 257/797 |
| 5,047,711 | 9/1991 | Smith et al. | 257/620 |
| 5,285,082 | 2/1994 | Axer | 257/620 |
| 5,684,304 | 11/1997 | Smears | 257/48 |

FOREIGN PATENT DOCUMENTS

| | | | |
|---|---|---|---|
| 59-52860 | 3/1984 | Japan | 257/620 |
| 62-81724 | 4/1987 | Japan | 257/620 |
| 2-211648 | 8/1990 | Japan | 257/620 |
| 404130643 | 5/1992 | Japan | 257/48 |
| 406061298 | 3/1994 | Japan | 257/48 |

*Primary Examiner*—Peter Toby Brown
*Assistant Examiner*—Hung Van Duong

[57] ABSTRACT

The testing of integrated circuits in a plurality of dice arranged in rows and columns in a semiconductor wafer is facilitated by effectively increasing the pitch between adjacent input/output bonding pads on each die by providing a plurality of test pads in scribing space between adjacent die. Alternate test pads are connected with alternate bonding pads on adjacent die, thereby effectively increasing the pitch of adjacent die for testing. After the integrated circuits are tested and defective circuits are marked, the wafer is scribed in the scribe space and broken to recover the individual die or integrated circuit chips.

3 Claims, 1 Drawing Sheet

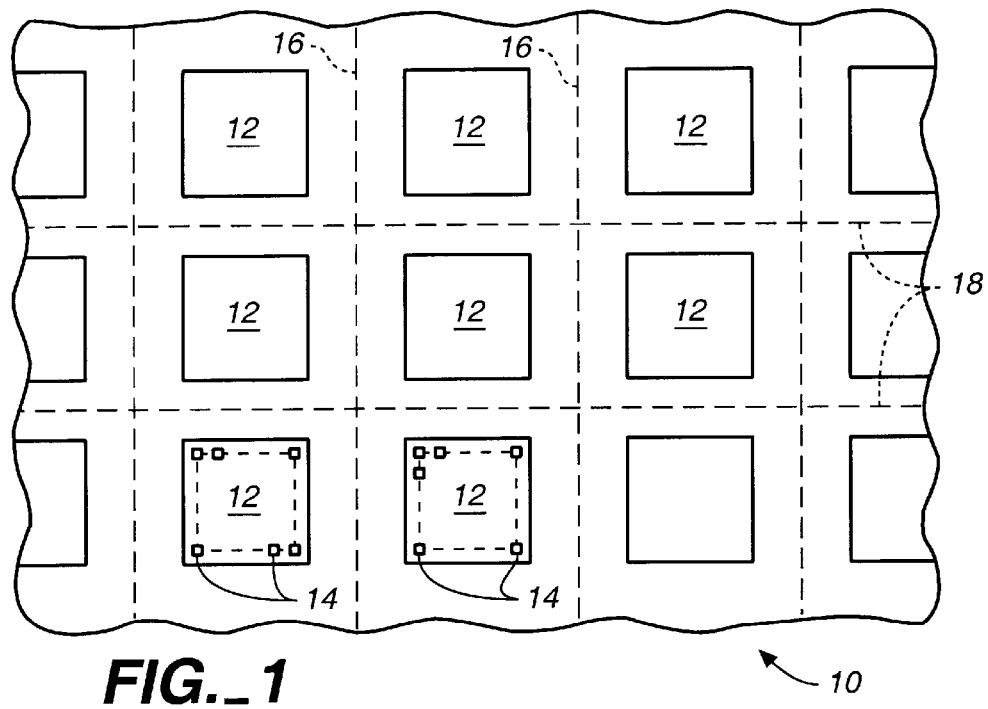
FIG._1
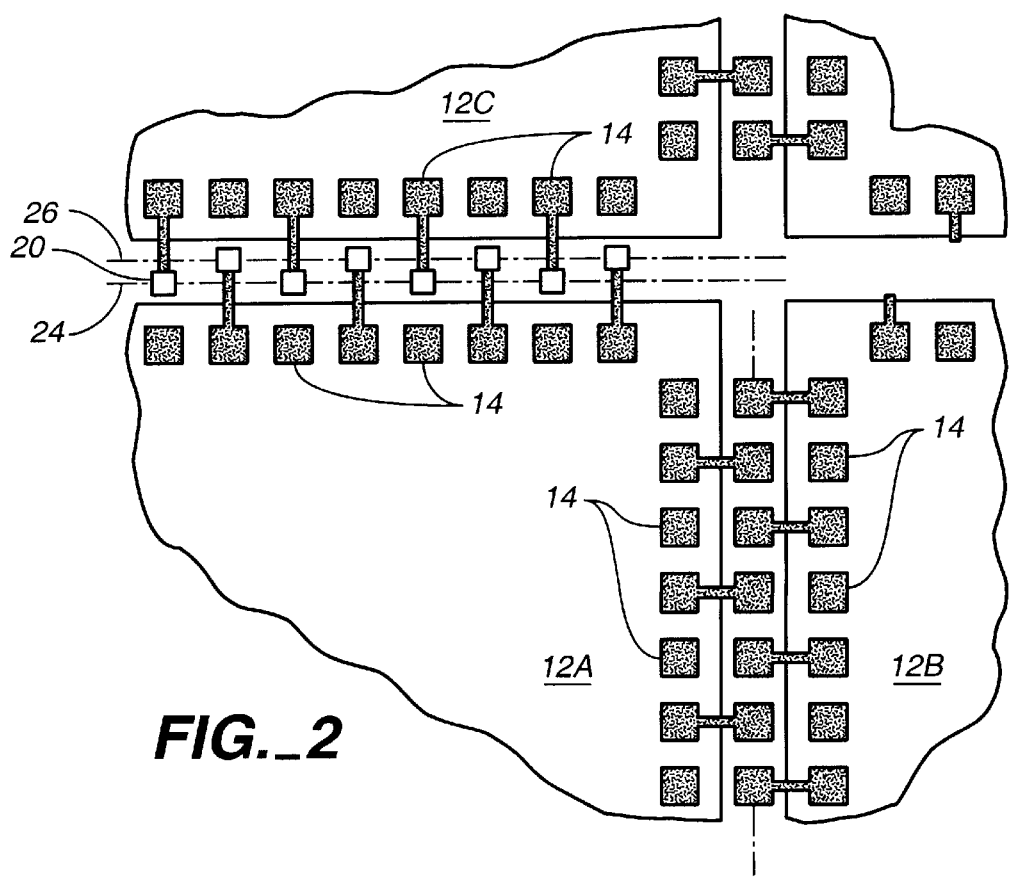
FIG._2

SEMICONDUCTOR DIE HAVING SACRIFICIAL BOND PADS FOR DIE TEST

BACKGROUND OF THE INVENTION

This invention relates generally to semiconductor integrated circuits fabricated as a plurality of die in a semiconductor wafer, and more particularly, the invention relates to the testing of die in a semiconductor wafer.

Semiconductor integrated circuits are fabricated as die in a semiconductor wafer using photo resist masking, chemical etching, and dopant implantation and diffusion techniques. Once the dice are completed and tested, the wafer is scribed and broken to obtain individual integrated circuit chips.

Before scribing and breaking the wafer, each individual integrated circuit is electrically probed and tested for functional integrity. Each die has input/output (I/O) pads along the periphery of the integrated circuit chip which are engaged by test heads having probes which contact the I/O pads.

As devices get more complicated, more and more bond pads are needed on the die. These pads are typically placed on the perimeter of the die for wire bonded and tape bonded packages. With a particular size of die, the number of bond pads that can be placed on the die is limited by the separation or pitch of the pads. One of the methods of getting the largest number of pads on a particular die is to decrease the separation or pitch of the pads, the smallest pitch being limited by the ability to test and bond to the die.

The pitch of the pads on a particular die are limited by the capability of testing the pads. In die testing, probes are used to contact the pads, and as the pitch of the pads gets smaller the probes have to be made smaller and positioned closer. This increases the difficulty of manufacturing the probes and the cost thereof. Further, as the probes get smaller, the current carrying capacity of the probes decrease and limit the test capability of the die.

Thus, the limit on the probe pitch limits the size of the die for a given number of bond pads. This can mandate a larger die than is required in the design and thus increases the cost of the die. As the probes get closer, the cost of making the probe cards increases, and the finer probes needed for fine pitch probing limits the current carrying capacity of the probe, thus reducing the effectiveness of testing the die.

SUMMARY OF THE INVENTION

In accordance with the invention the scribe space between die on a wafer is provided with test pads which are interconnected with selected I/O bond pads on each die so that the pitch or distance between adjacent I/O bond pads is effectively increased for test purposes. The test pads are not required for later circuit interconnect in operation, and the test pads can be destroyed when the wafer is scribed and broken.

In one embodiment of the invention, two rows of test pads are spaced at twice the pitch of the bond pads between two adjacent dice with each row of test pads connected to alternate bond pads an the adjacent die.

In another embodiment of the invention, a single row of test pads is provided with the same pitch as the bond pads on adjacent dice, and alternate test pads are connected to bonding pads on the two dice to effectively increase the pitch of pads for testing each die.

The invention and objects and features thereof will more readily apparent from the following detailed description and appended claims when taken with the drawing.

BRIEF DESCRIPTION OF THE DRAWINGS

FIG. 1 is a plan view of a portion of a semiconductor wafer and a plurality of dice therein.

FIG. 2 is an enlarged plan view of adjacent dice which illustrates test pads in accordance with the invention.

DETAILED DESCRIPTION OF ILLUSTRATIVE EMBODIMENT

FIG. 1 is a plan view of a portion of a semiconductor wafer 10 in which a plurality of integrated circuit dice 12 are formed in parallel rows and columns. Each integrated circuit die has a plurality of input/output (I/O) bonding pads along the periphery of the integrated circuit.

Once the integrated circuits have been fabricated and tested, the wafer is scribed along vertical lines 16 and horizontal lines 18 in scribe space between the individual dice, and the wafer is then broken to recover each of the integrated circuit chips 12. However, prior to scribing and breaking the wafer, test probes are employed for contacting the bond pads 14 on each individual die for testing the functional integrity of the integrated circuit. Defective circuits can be marked and discarded after the wafer is scribed and broken. As described above, testing requires the ability to contact the bond pads 14 with a test head having individual probes for contacting each of the bond pads 14. The capability of testing the integrated circuits is limited by the pitch of the pads 14.

In accordance with the present invention, the pitch of bond pads of integrated circuits for test purposes is effectively increased by providing a plurality of test pads in the scribe space between individual die as illustrated in FIG. 2. In one embodiment of the invention, test pads 20 are linearly aligned along a center line 22 in the scribe space between die 12A and die 12B with first alternate test pads 20 connected to alternate bond pads 14 of die 12A, and a second alternate test pads 20 connected to alternate bond pads on die 12B. Thus, the pitch between adjacent bond pads is effectively increased for test purposes and facilitates the probing of each integrated circuit for test purposes. The connection of test pads to bonding pads is readily provided by dopants introduced into the wafer to define interconnects, or by deposited metal, such as aluminum.

In another embodiment of the invention, first and second pluralities of test pads 20 are aligned along two center lines 24, 26 between dice 12A and 12C. Again, the alternate test pads are connected to alternate bonding pads on die 12A and on die 12C. However, by offsetting the first and second pluralities of test pads as illustrated by the spaced center lines 24, 26, further spacing of test probes can be accommodated. This assumes that the scribe space between adjacent dice is sufficiently wide to accommodate the offset pluralities of test pads.

After testing of the integrated circuits and marking any defective circuits, the wafer is scribed and broken as described above. The test pads can be removed during the scribing and breaking operation or the extra pads can be left on the die.

By providing test pads in the scribe space between adjacent dice in a semiconductor wafer, the probing of bond pads on each integrated circuit for test purposes is facilitated without increasing the size of each die. While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A semiconductor wafer comprising:

a plurality of integrated circuit dice arranged in rows and columns separated by scribing space for scribing and breaking the wafer, each die having a plurality of bonding pads positioned along the periphery of the die as input/output contacts, and a plurality of test pads in the scribing space; wherein the shortest distance between one of the plurality of test pads, interconnected to a first one of the plurality of integrated circuit dice, and a second one of the plurality of integrated circuit dice is less than the shortest distance between at least one of the plurality of test pads, interconnected to the second one of the plurality of dice, and the second one of the plurality of integrated circuit dice.

2. The semiconductor wafer as defined by claim 1 wherein there are no testing pads between the one of the plurality of test pads connected to the first one of the plurality of integrated circuit dice and the one of the plurality of test pads connected to the second one of the plurality of integrated circuit dice.

3. The semiconductor wafer as defined by claim 1 wherein at least some of the plurality of test pads are interconnected with selected bonding pads of an adjacent die.

* * * * *